US010790432B2

(12) United States Patent
Olivadese et al.

(10) Patent No.: US 10,790,432 B2
(45) Date of Patent: Sep. 29, 2020

(54) CRYOGENIC DEVICE WITH MULTIPLE TRANSMISSION LINES AND MICROWAVE ATTENUATORS

(71) Applicant: International Business Machines Corporation, Armonk, NY (US)

(72) Inventors: Salvatore Bernardo Olivadese, Stamford, CT (US); James Robert Rozen, Peekskill, NY (US); Patryk Gumann, Tarrytown, NY (US); Martin O. Sandberg, Ossining, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 125 days.

(21) Appl. No.: 16/047,516

(22) Filed: Jul. 27, 2018

(65) Prior Publication Data

US 2020/0035901 A1    Jan. 30, 2020

(51) Int. Cl.
*H03H 7/24*    (2006.01)
*H01L 39/02*   (2006.01)
(Continued)

(52) U.S. Cl.
CPC .............. *H01L 39/02* (2013.01); *H01L 39/24* (2013.01); *H01P 3/003* (2013.01); *H01P 3/08* (2013.01);
(Continued)

(58) Field of Classification Search
CPC ... H03H 7/24; H01P 3/003; H01P 3/08; H01P 3/081; H01P 1/227; H01P 1/22; H01P 1/222; H01L 39/02; H01L 39/24
(Continued)

(56) References Cited

U.S. PATENT DOCUMENTS 3,227,975 A    1/1966  Hewlett et al.
3,792,384 A *  2/1974  Hunt ..................... H01L 23/647
                                                    333/238
(Continued)

FOREIGN PATENT DOCUMENTS

CN    102637935       8/2012
CN    105718945 A     6/2016
(Continued)

OTHER PUBLICATIONS

Haydl et al., Attenuation of Millimeterwave Coplanar Lines on Gallium Arsenide and Indium Phosphide Over the Range 1-60 GHz, 1992, IEEE MTT-S Digest, pp. 349-352.*
(Continued)

*Primary Examiner* — Stephen E. Jones
(74) *Attorney, Agent, or Firm* — Amin, Turocy & Watson, LLP

(57) ABSTRACT

Techniques for implementing multiple microwave attenuators on a high thermal conductivity substrate for cryogenic applications to reduce heat and thermal noise during quantum computing are provided. In one embodiment, a device for using in cryogenic environment is provided that comprises a substrate having a thermal conductivity above a defined threshold, a plurality of transmission lines fabricated on the substrate and arranged with a separation gap between the plurality of transmission lines to maintain crosstalk below −50 decibels, and one or more microwave attenuators embedded on the plurality of transmission lines.

22 Claims, 11 Drawing Sheets

(51) Int. Cl.
*H01L 39/24* (2006.01)
*H01P 3/00* (2006.01)
*H01P 3/08* (2006.01)
*H01P 11/00* (2006.01)
*H03H 3/00* (2006.01)

(52) U.S. Cl.
CPC ............ *H01P 3/081* (2013.01); *H01P 11/003* (2013.01); *H03H 3/00* (2013.01); *H03H 7/24* (2013.01)

(58) Field of Classification Search
USPC .............................................. 333/81 A, 81 R
See application file for complete search history.

(56) References Cited

U.S. PATENT DOCUMENTS

| | | | |
|---|---|---|---|
| 5,062,809 A | 11/1991 | Sakamoto et al. | |
| 5,805,030 A * | 9/1998 | Dhuey | G06F 13/4077 333/1 |
| 6,463,192 B1 * | 10/2002 | Kapany | G02B 6/35 385/17 |
| 7,409,372 B2 | 8/2008 | Staelin et al. | |
| 8,198,956 B2 | 6/2012 | U-Yen et al. | |
| 8,405,468 B2 | 3/2013 | Uchaykin | |
| 8,441,329 B2 | 5/2013 | Thom et al. | |
| 9,762,200 B2 | 9/2017 | Thom et al. | |
| 2011/0125734 A1 | 5/2011 | Duboue et al. | |
| 2012/0153132 A1 * | 6/2012 | Horiguchi | G02B 6/4274 250/214 A |
| 2014/0264287 A1 | 9/2014 | Abraham et al. | |
| 2016/0292587 A1 | 10/2016 | Rigetti et al. | |
| 2017/0257074 A1 | 9/2017 | Yeh et al. | |

FOREIGN PATENT DOCUMENTS

| | | |
|---|---|---|
| CN | 106127729 A | 11/2016 |
| CN | 106296692 A | 1/2017 |
| CN | 106845471 A | 6/2017 |
| CN | 107025284 A | 8/2017 |
| CN | 107147603 A | 9/2017 |
| CN | 107240085 A | 10/2017 |
| EP | 1474822 | 11/2004 |
| EP | 3217336 A1 | 9/2017 |
| WO | 9203887 A1 | 3/1992 |
| WO | 2005/078856 | 8/2005 |
| WO | 2009058858 A1 | 5/2009 |

OTHER PUBLICATIONS

Cano et al., "Ultra-Wideband Chip Attenuator for Precise Noise Measurements at Cryogenic Temperatures," IEEE Transactions on Microwave Theory and Techniques, vol. 58, No. 9, Sep. 2010, pp. 2504-2510, 7 pages.

Zagorodny et al., "Microwave microstrip attenuators for GaAs monolithic integrated circuits," XIII International Conference and Seminar on Micro/Nanotechnologies and Electron Devices EDM, 2012, pp. 67-71, 5 pages.

Lane, "Nichrome Resistor Properties' and Reliability," Rome Air Development Center, Air Force Systems Command, Distributed by: National Technical Information Service, U. S. Department of Commerce, 73 pages. 1973.

Bansal et al., "Design and Analysis of Thin Film Nichrome Resistor for GaN MMICs," Third International Conference on Devices, Circuits and Systems, 2016, pp. 145-148, 4 pages.

Riaziat et al., "Propagation Modes and Dispersion Characteristics of Coplanar Waveguides," IEEE Transactions on Microwave Theory and Techniques, vol. 38, No. 3, Mar. 1990, pp. 245-251, 7 pages.

Ventura et al., "Thermal Properties of Solids at Room and Cryogenic Temperatures," International Cryogenics Monograph Series, 2014, pp. 131-168, 38 pages.

Childs et al., "Thermal Conductivity of Solids at Room Temperature and Below," U.S. Department of Commerce, Cryogenics Division, Institute for Basic Standards, National Bureau of Standards, Issued Sep. 1973, 625 pages.

Mueller et al., "Printed Circuit Board Metal Powder Filters for Low Electron Temperatures," Review of Scientific Instruments, 2013, 13 pages, 84, 044706: https://doi.org/10.1063/1.4802875.

Yeh et al., "Microwave attenuators for use with quantum devices below 100 mK," Journal of Applied Physics, 2017, 10 pages, 121, 224501: https://doi.org/10.1063/1.4984894.

International Search Report and Written Opinion for International Application No. PCT/IB2018/058438 dated Feb. 20, 2019 9 pages.

* cited by examiner

CRYOGENIC DEVICE WITH MULTIPLE TRANSMISSION LINES AND MICROWAVE ATTENUATORS

BACKGROUND

The subject disclosure relates generally to cryogenic devices and, more particularly, to cryogenic devices having multiple transmission lines with microwave attenuators on a high thermal conductivity substrate to reduce heat and thermal noise during quantum computing.

Supercomputers (e.g., quantum computers) are powerful machines capable of processing information substantially faster and more efficiently than general computers. Built on principles of quantum physics, quantum computing can execute new types of algorithms and process information more holistically than conventional computing systems. Quantum computers can be used for new drug discovery, optimization of man-made systems, artificial intelligence and a host of other applications.

Quantum computers are based on operation of qubits, which operate according to principles of quantum physics: superposition and entanglement. Superposition means that a qubit represents both values of 1 and 0 at the same time. Entanglement means that the qubits can be correlated with each other wherein the state of one qubit can depend on the state of another qubit. Using these principles, qubits can act as sophisticated switches. A single qubit can represent both values 0 and 1 simultaneously (or concurrently) and in combinations. Two qubits can represent four values simultaneously (or concurrently) (e.g., 00, 01, 10, 11). Similarly, three qubits can represent $2^3$ values and 50 qubits can represent $2^{50}$ values simultaneously (or concurrently).

Quantum bits can be implemented in several vastly different systems ranging from traveling photons to micro fabricated electrical circuits. In the latter case the qubits typical operate in the few gigahertz regime. This makes the qubits sensitive to thermal noise. To protect qubits from thermal noise, they are cooled down to temperatures of only a few millikelvin using for instance cryogenic dilution refrigerator. Control and measurements signals for the quantum bits are delivered through microwave coaxial lines. Due to limitations of the number of qubits that can be multiplexed per line several input lines are typically needed to operate a quantum processor. To operate the quantum computer efficiently, significant amount of attenuation is applied at each stage of refrigeration to protect the qubit from thermal noise. However, a drawback of such system is that using a discrete attenuator for each becomes impractical for more than a few lines (for example, more than 50 lines). To increase drive line density, attenuators with small footprint becomes necessary. Furthermore, microwave lines must be connected between the stages in the cryostat using high density connections rather than individual connections.

There have been several efforts to apply attenuation by using different sizes and types of attenuators. Currently, sub-miniature version A (SMA)/sub-miniature push-on (SMP) attenuators are used. However, these styles of attenuators are large (e.g., approximately 5 millimeters (mm) diameter) and thus not practical as more input lines are added. Integrated solutions such as microelectromechanical system (MEMS) attenuators, are small, but are difficult to combine and difficult to assemble. Further, these existing solutions do not achieve the desired result of implementing an integrated solution that uses multiple attenuators on a single substrate for quantum applications while maintaining low crosstalk (e.g., signal leakage between transmission lines). With some solutions, crosstalk is too high when attenuators are close to each other. Also, the substrate used in these solutions do not provide adequate thermalization (e.g., extraction of heat that is generated when signal power is reduced by attenuators), which can impact the qubit. Finally, these options are not miniaturized to allow increasing line density.

SUMMARY

The following presents a summary to provide a basic understanding of one or more embodiments of the invention. This summary is not intended to identify key or critical elements, delineate scope of the embodiments or scope of the claims. Its sole purpose is to present concepts in a simplified form as a prelude to the more detailed description that is presented later. In one or more embodiments described herein, systems, methods, apparatus and/or computer program products that facilitate cryogenic devices are described.

According to an embodiment, a device is provided. In one example, the device comprises a substrate having a thermal conductivity above a defined threshold. In one or more implementations, a plurality of transmission lines fabricated on the substrate and arranged with a separation gap between the plurality of transmission lines to maintain crosstalk below −50 decibels (dB). In one or more implementations, the device comprises one or more microwave attenuators embedded on the plurality of transmission lines. The advantage of such a device is that a manufacturer of a quantum computer can increase the number of drive lines that can be installed in the cryostat using a small footprint while maintaining low crosstalk between lines.

In some examples, the microwave attenuators comprise of a metal alloy composed of a material selected from the group consisting of Nichrome, Constantan, and Manganin. The advantage of such a device is that a cryogenic device according to innovation can operate under various temperatures while maintaining the desired microwave attenuators in the transmission line.

In another embodiment, a method is provided. In one example, the method comprises forming a plurality of transmission lines on a substrate comprised of a material having a thermal conductivity greater than a defined value, where the plurality of transmission lines are arranged with a separation gap between the plurality of transmission lines to maintain crosstalk below −50 dB. In one or more implementations, the method comprises embedding microwave attenuators on respective ones of the plurality of transmission lines. An advantage of such method is that a manufacturer of a quantum computer can increase the number of qubits that can be operated by increasing the transmission lines using a small footprint while maintaining crosstalk below a threshold.

In some examples the microwave attenuators can be formed from a metal alloy composed of a material selected from the group consisting of Nichrome, Constantan, and Manganin. An advantage of such method is that a cryogenic device according to the innovation can operate under various temperatures while maintaining the desired microwave attenuators in the transmission line.

In another embodiment, a structure is provided that includes a substrate comprising a material selected from a group consisting of Sapphire, Silicon and Gallium Arsenide. In one or more implementations, the structure comprises a plurality of transmission lines fabricated on the substrate and arranged such that crosstalk between the plurality of transmission lines is below −50 dB. In some embodiments, the structure comprise one or more microwave attenuators embedded in a transmission line of the plurality of transmission lines, where the attenuation value of a microwave attenuator of the one or more microwave attenuators are set to a desired attenuation level. The advantage of such a structure is that a manufacturer of a quantum computer can increase the number of qubits that can be operated by increasing the transmission lines while maintaining a small footprint and maintaining crosstalk below a threshold.

In some examples, the structure further comprises a metal alloy coupling the microwave attenuator to the substrate. The advantage of such a structure is that a cryogenic device according to innovation can operate under various temperatures while securing the microwave attenuators on the substrate.

In another embodiment, a method is provided that comprises forming a substrate comprising material selected from a group consisting of Sapphire, Silicon and Gallium Arsenide. In one or more implementations, the method further comprises forming a plurality of coplanar waveguides on the substrate and arranged with a defined separation gap between the plurality of coplanar waveguides to achieve crosstalk of less than minus 50 decibels. In one or more implementations, the method further comprises embedding one or more microwave attenuators on a transmission line of the plurality of coplanar waveguides, where dimensions of a microwave attenuator of the one or more microwave attenuators are based on a defined attenuation level. The advantage of such a method is that a manufacturer of a quantum computer can increase the number of qubits that can be operated by increasing the transmission lines while maintaining a small footprint and maintaining crosstalk below a threshold.

In some examples, the method can further comprise coupling a metal alloy between at least one of the one or more microwave attenuators and at least one of the plurality of coplanar waveguides. In one or more implementations, the method comprises coupling the at least one of the one or more microwave attenuators to the substrate via a resistive material. An advantage of such method is that a cryogenic device according to innovation can operate in cryogenic temperatures while securing the microwave attenuators on the substrate.

In another embodiment, a method is provided that comprises forming a substrate having a thermal conductivity greater than 100 watts per meter-Kelvin. In one or more implementations, the method further comprises forming a plurality of coplanar waveguides on the substrate and arranged with a defined separation gap between the plurality of coplanar waveguides to achieve crosstalk of less than minus 50 decibels. In one or more implementations, the method further comprises forming one or more connectors positioned around at least a portion of the substrate and connected to the plurality of transmission lines, wherein the connectors have a density greater than 1 connection per 5 mm. The advantage is that the substrate and the transmission lines can then easily be connected to high density microwave connectors rather than individual connectors.

DETAILED DESCRIPTION

The following detailed description is merely illustrative and is not intended to limit embodiments and/or applications or uses of embodiments. Furthermore, there is no intention to be bound by any expressed or implied information presented in the preceding Summary section, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident; however, in various cases, that the one or more embodiments can be practiced without these specific details.

Given the aforementioned issues with conventional implementation of attenuators on transmission lines, one or more embodiments can be implemented to produce a cryogenic device with multiple transmission lines that provide a solution to one or more of those issues. In one or more embodiments, a miniaturized solution is provided that will maintain crosstalk below −50 dB by using multiple integrated microwave attenuators on a high thermal conductivity substrate. As used herein, the term "high thermal conductivity" means a thermal conductivity greater than about 100 Watt per meter-Kelvin. The miniaturized solution provides cost efficiencies, scalability to use more input lines that will process higher number of qubits, and easy to assemble. Such a cryogenic device can have an advantage of improved scaling because of a reduced footprint while maintaining crosstalk below −50 dB. Such cryogenic device can also have an advantage of providing a miniaturized solution (e.g., a small chip having 50 or more transmission lines) that will allow use of multiple transmission lines in a small space. Such a cryogenic device can also have an advantage of providing easy assembly and can operate in varying temperatures (e.g., room temperature to −4 Kevin (~459.67 Fahrenheit)). Additionally, such a cryogenic device can be easily configured to use at each stage of a refrigeration process and can operate at different temperatures (e.g., near subzero, 0 Kelvin or −459.67 Fahrenheit).

Figure 1:
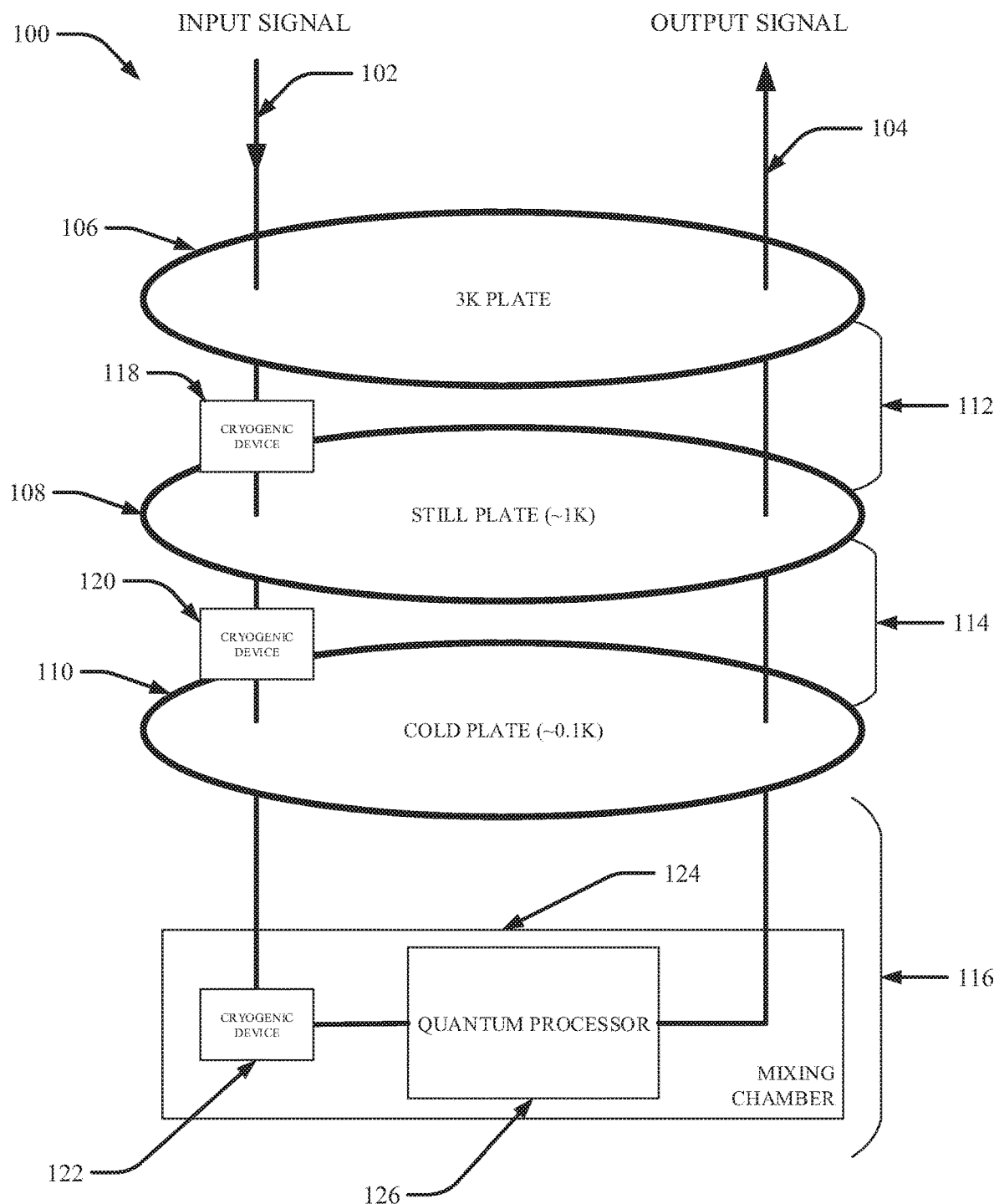
FIG. 1 illustrates an example, non-limiting dilution refrigeration system in accordance with one or more embodiments described herein.

FIG. 1 illustrates an example, non-limiting dilution refrigeration system 100 in accordance with one or more embodiments described herein. As depicted, the dilution refrigeration system 100 comprises an input line 102, an output line 104, a 3K plate 106, a still plate 108, a cold plate 110, one or more cryogenic devices 118, 120 and 122, a mixing chamber and a quantum processor 126. In some examples, the input line 102 and the output line 104 represent multiple transmission lines (described in FIG. 2). Input line 102 and output line 104 transport qubit information to and from the quantum processor 126, respectively.

The refrigeration system 100 comprises a first stage 112, a second stage 114 and a third stage 116 of refrigeration. In some examples, the cryogenic devices 118, 120 and 122 are coupled to the input line 102 at separate stages of refrigeration 112, 114 and 116 in the dilution refrigeration system 100. In some examples, the cryogenic device 118 is coupled to the input line 102 that passes through the first stage of refrigeration 112, which is formed by the 3K plate 106 and the still plate 108. The cryogenic device 120 is coupled to the input line 102 that passes through the second stage of refrigeration 114, which is formed by the still plate 108 and the cold plate 110. The cryogenic device 122 is placed on the input line 102 in the third stage of refrigeration 116, which is formed below the cold plate 110. The third stage of refrigeration comprises a mixing chamber 124 and the quantum processor 126. The third stage of refrigeration 116 is the coldest stage in the dilution refrigeration system 100. In some examples, the cryogenic device 122 is coupled to the input line 102 in the mixing chamber 124. In some examples, the cryogenic devices 118, 120 and 122, can have different configuration for each stages 112, 114 and 116 of refrigeration.

Figure 2:
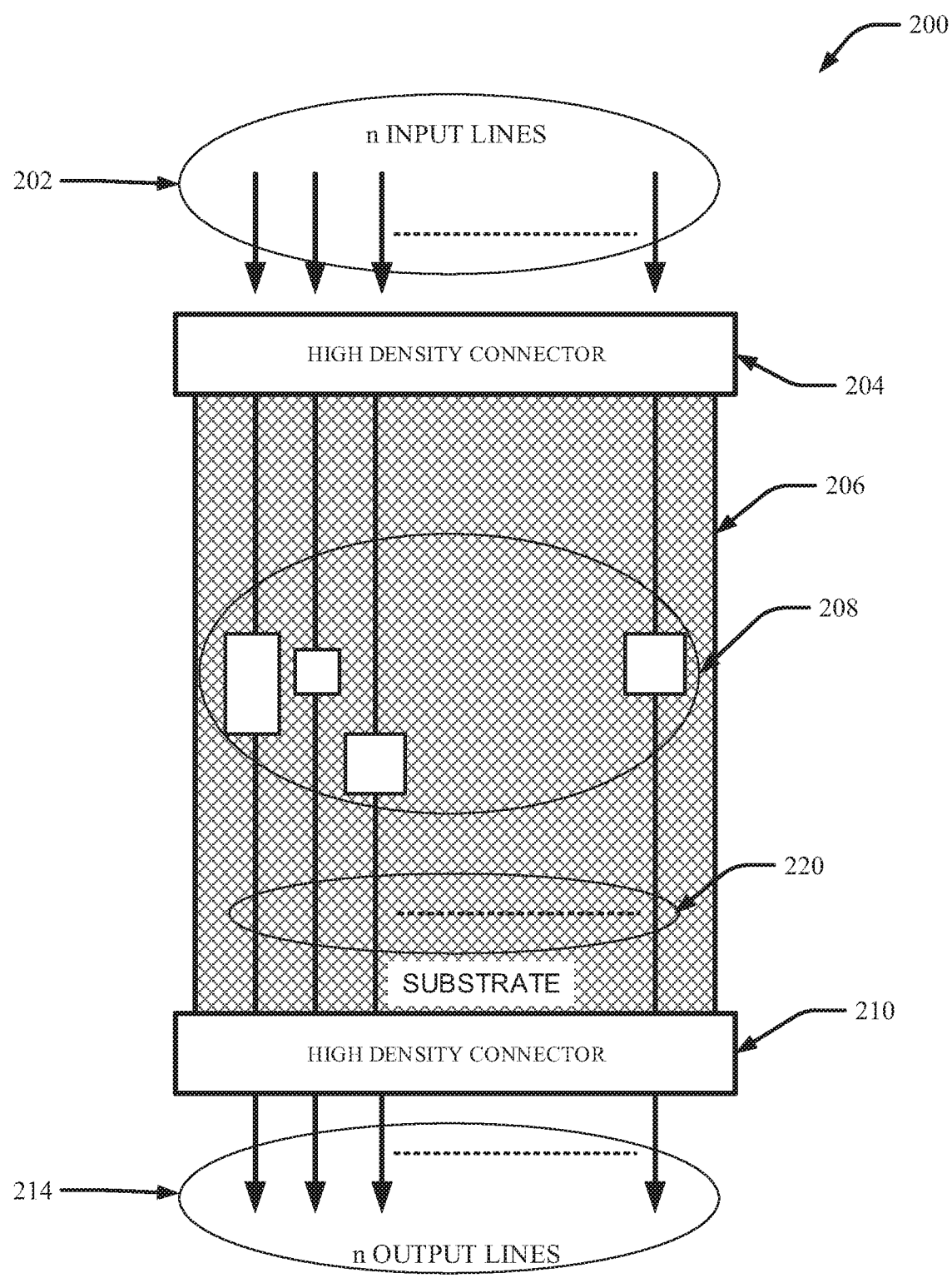
FIG. 2 illustrates an example, non-limiting cryogenic device in accordance with one or more embodiments described herein.

FIG. 2 illustrates an example, non-limiting cryogenic device 200 in accordance with one or more embodiments described herein. As depicted, a cryogenic device 200 comprises a first connector 204, a second connector 210 and a substrate 206. In some examples, a plurality of transmission lines 220 are fabricated on the substrate 206. Additionally, in some examples, a plurality of integrated microwave attenuators 208 are coupled to the transmission lines 220 to attenuate signal power of the transmission lines 206.

In one or more embodiments, the first connector 204 and second connector 216 comprises high density material and positioned around at least a portion of the substrate 206. The first connector 204 converts a set of input lines 202 (e.g., coaxial cables), to corresponding transmission lines 220 that are fabricated on the substrate 206. The second connector 210 converts the transmission lines 220, to corresponding output lines 214 that can be coaxial cables. In some examples, the connector 204 and the connector 210 can be high density connectors made from spring pins and coupled to transmission lines 220. In some examples, the connector 204 and the connector 210 can be pogo pings made using high density material. In some embodiments, the connectors 204 and 210 positioned around and connected to the plurality of transmission lines 220, wherein the connectors 204 and 210 have a density greater than 1 connection per 5 mm.

The connectors, 204 and 210, allow the cryogenic device 200 to connect to other cryogenic devices operating in adjacent stages of refrigeration (e.g., 112, 114 and 116 of FIG. 1).

In one or more embodiments, the substrate 206 is constructed with high thermal conductivity material. As used herein, the term "high thermal conductivity" represents a threshold and means thermal conductivity greater than 100 watts per meter-Kelvin (κ>100 watts per meter-Kelvin). In some examples, substrate 206 can have thicknesses of, for example, 5 micrometers to 800 micrometers. Then, in some examples, various materials and thicknesses can be used to construct the substrate 206 to allow operation in varying temperatures (e.g., room temperature to −459.67 Fahrenheit). The substrate 206 is made of high thermal conductive materials capable of maintaining conductivity at cryogenic temperatures. In some examples, the substrate 206 can be constructed using Silicon (Si) and can be as small as 5 mm. In one or more embodiments, different materials can be used to construct the substrate 206, such as Sapphire, GaAs, Alumina or Quartz that have high thermal conductivity. The advantage of using high thermal conductivity material for the substrate 206 is that smaller surface (e.g., 5 mm substrate 206) with multiple transmission lines 220 having integrated microwave attenuators 208 can be utilized while maintaining crosstalk below −50 dB.

In one or more embodiments, transmission lines 220 are fabricated on the substrate 206 having high thermal conductivity. The transmission lines 220 are for transmitting qubits, one transmission line for one qubit. In some examples, number of transmission lines 220 can be 100 or more. In some examples, the transmission lines 220 can be formed on the substrate 206 and arranged with a separation gap between the transmission lines to maintain crosstalk below −50 decibels. In some examples, the transmission lines 220 can be coplanar waveguide, which has low crosstalk (e.g., below −50 dB). In some examples, the coplanar waveguides (e.g., transmission lines 220) comprises a connection for grounding the integrated microwave attenuators 208. In some examples, the transmission lines 220 having a predetermined attenuation which does not vary with temperature as the transmission lines 220 are cooled down. The density of these transmission lines 220 can be high, with low crosstalk, such that the connectors 204 and 216 can be attached to the transmission lines 220 on the substrate 206. The advantage of having high density transmission lines 206 is that higher density of cables can be used in the cryostat. The advantage of using coplanar waveguide for the transmission lines 220 is that a vertical interconnect access (e.g., via) would not be required to ground the integrated microwave attenuators 208. In one or more embodiments, transmission lines 220 comprises superconductive materials such as microstrip material (e.g. microstrip geometry) or stripline material (e.g. stripline geometry).

In one or more embodiments, the integrated microwave attenuators 208 are embedded on transmission lines 220. In some examples, one integrated microwave attenuator 208 per one transmission line. In some examples, one or more integrated microwave attenuators 208 can be embedded on a single transmission line to maintain crosstalk below −50 dB. In some examples, a high resistivity material, such as metal alloy, capable of operating from room temperature to subzero temperatures, is used to secure the integrated microwave attenuators 208 to the transmission lines 220. In some examples, the metal alloy is composed of a material selected from the group consisting of Nichrome, Constantan, and Manganin (e.g., an alloy that consists of Copper, Nickel, and Manganese). In some examples, the integrated microwave attenuator with a Tee (T) configuration is used (discussed in FIG. 3 below). In some examples, the integrated microwave attenuator with a Pi (π) configuration (not shown) can be used and embedded in the transmission line to control the signal power.

Figure 3:
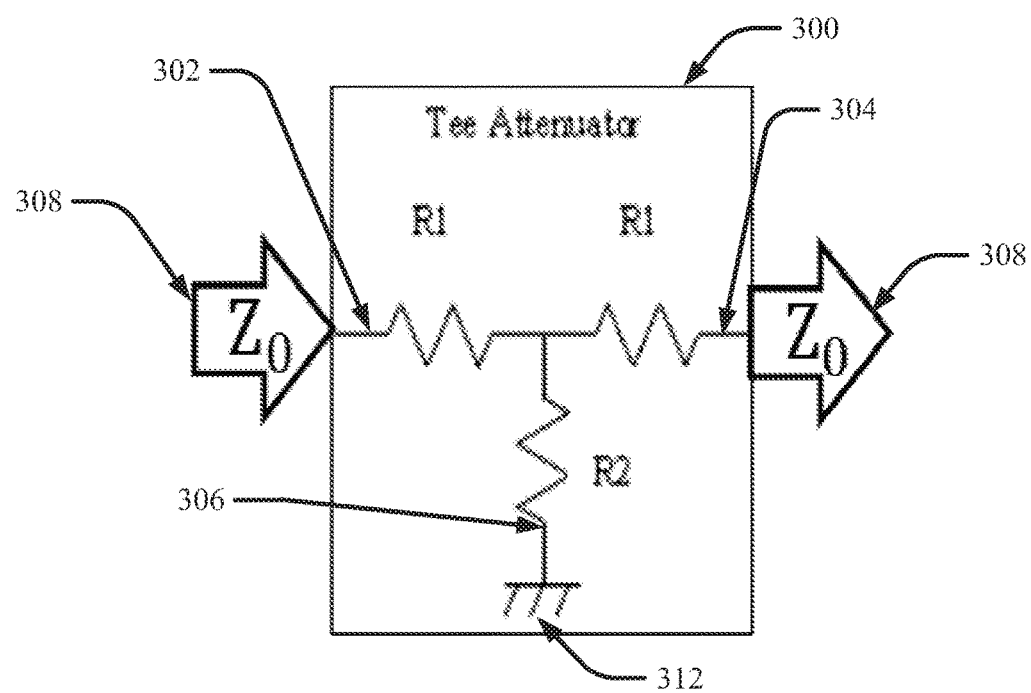
FIG. 3 illustrates an example, non-limiting integrated microwave attenuator in accordance with one or more embodiments described herein.

FIG. 3 illustrates an example, non-limiting integrated microwave attenuator 300 in accordance with one or more embodiments described herein. As depicted, a integrated microwave attenuator 300 is embedded on a transmission line 308 of the plurality of transmission lines 220 (e.g., FIG. 2). In some examples, the transmission line 308 is operating at 50 Ohm. In one or more embodiment, the integrated microwave attenuator 300 can be a "T" design and comprises two R1 resistors 302 and 304 and a R2 resistor 306, wherein the R2 resistor 306 comprises a ground component 312. The R2 resistor 306 can be coupled to both R1 resistors, 302 and 304, and provides a grounding functionality. In one or more embodiments, the size of the R1 resistors, 302 and 304, and R2 resistor 306 is based on the formula provided below.

$$R1 = Z_0 \frac{10^{A/20} - 1}{10^{A/20} + 1}$$

$$R2 = \frac{2Z_0}{10^{A/20} - 10^{-A/20}}$$

A: desired attenuation in dB
$Z_0$: input/outline impedance, usually 50 Ohm

In some implementations, level of attenuation required for an integrated microwave attenuator 300 is determined by amount of power that needs to be reduced for the transmission line 308. Once level attenuation is determined, value of resistors (e.g., 302, 304 and 306) can be derived. Once the respective value(s) of the resistors is derived, the amount of resistive material needed can be determined.

In one or more embodiments, one or more integrated microwave attenuators 300 are coupled to the substrate 206 via transmission lines 220 using a resistive material (e.g., resistive element), wherein the resistive element exhibits resistivity from room temperature to a cryogenic temperature without a superconducting transition (e.g., zero resistance). In some examples, the shape of the integrated microwave attenuator 300 is determined by using the value of attenuation.

In some examples, the resistive material is a high resistivity material, such as metal alloy, with stable features from room temperature to cryogenic temperatures. In some examples, the dielectric resistive material is a high resistivity material nickel chromium (NiCr) having stable resistivity in the temperature range of 270K-0.1K (e.g., cryogenic temperature).

In one or more embodiments, the amount and the shape of metal alloy is determined based on resistivity needed. Following formula may be used to generate the dimensions (e.g., amount) of the metal alloy and the dimensions of the integrated microwave attenuator 300.

Figure 4:
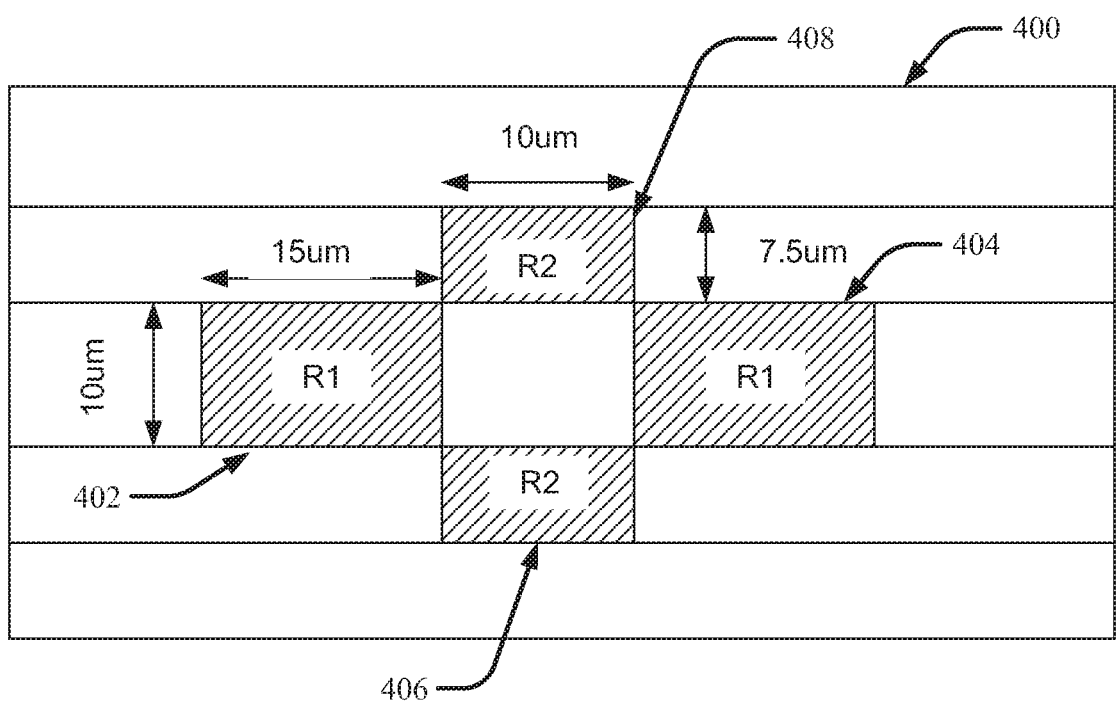
FIG. 4 illustrates an example, non-limiting integrated microwave attenuator in accordance with one or more embodiments described herein.

For example, resistive elements using metal alloy, like NiCr, resistance is defined as $R=R_s\, l/w$, where $R_s$ is the sheet resistance. For example, using 75 nanometers deposited NiCr, $R_s=27\Omega$.

w = 10 um, $l_1 \cong 15$ um → R1 = 40.91 Ohm
$l_2 \cong 3.75$ um → R2 = 10.1 Ohm FIG. 4 illustrates an example, non-limiting arrangement 400 of the resistors in accordance with one or more embodiments described herein. In some examples, the integrated microwave attenuator 400 is configured to use two R1 resistors, 402 and 404, and two R2 resistors 406 and 408. In some embodiments, both R2 resistors, 406 and 408, are placed in parallel. In some examples, the size of the resistors R1, 402 and 404, and R2 resistors 406 and 408 is based on the formula provided above.

Figure 5:
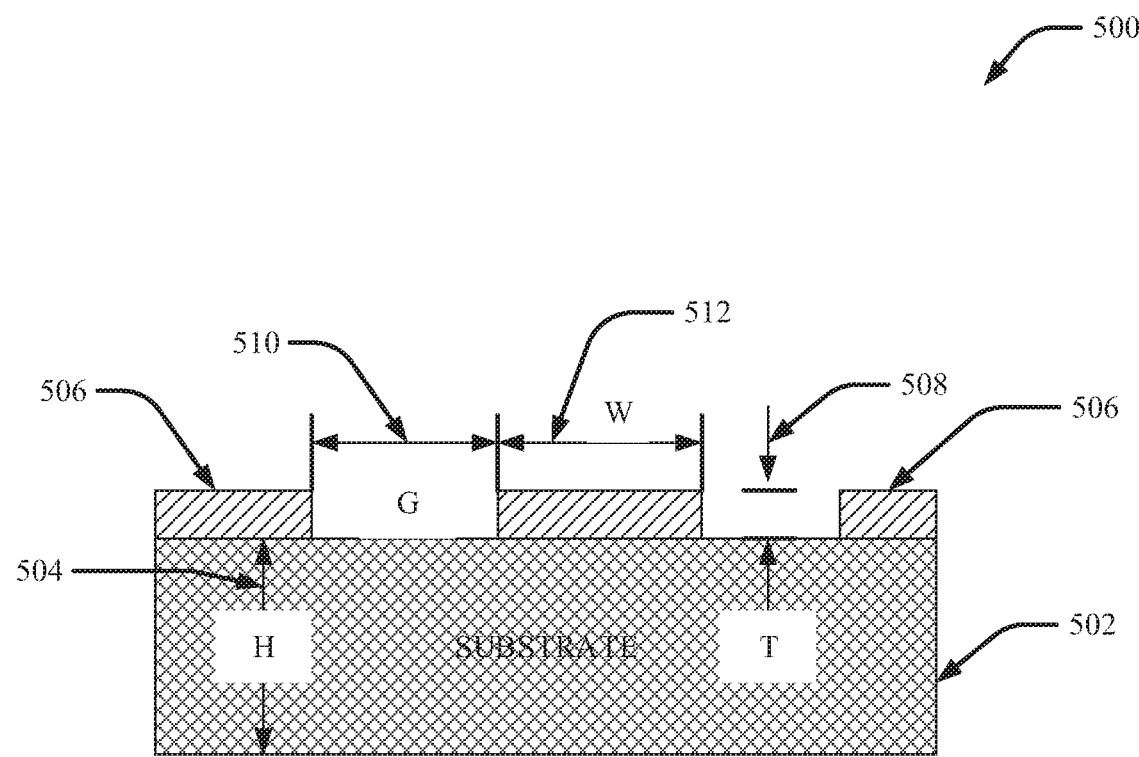
FIG. 5 illustrates an example, non-limiting arrangement of transmission lines in accordance with one or more embodiments described herein.

FIG. 5 illustrates an example, non-limiting arrangement 500 of transmission lines in accordance with one or more embodiments described herein. As depicted, the arrangement 500 comprises a substrate 502 and transmission lines 506 formed thereon. In some examples, as illustrated, the transmission lines 506, having a height (e.g., thickness) value of "T" 508 and the substrate 502 with a height value of "H" 504. In some examples, the transmission lines 506 has a gap 510 between the transmission lines 506. The gap 510 between transmission lines are for maintaining crosstalk between the transmission lines 506 below −50 dB. In some examples, the gap 510 can be adjusted based on the size and shape of the integrated microwave attenuator 300. In some examples, an impedance of transmission line 506 is kept at 50 Ohm, regardless of size of the integrated microwave attenuator 300, by adjusting width 512 of transmission line 506. In some examples, to maintain the impedance level of 50 Ohm for the transmission lines 506, the values for the height 508, values for the gap 510 and value for the width 512 are adjusted.

Figure 6:
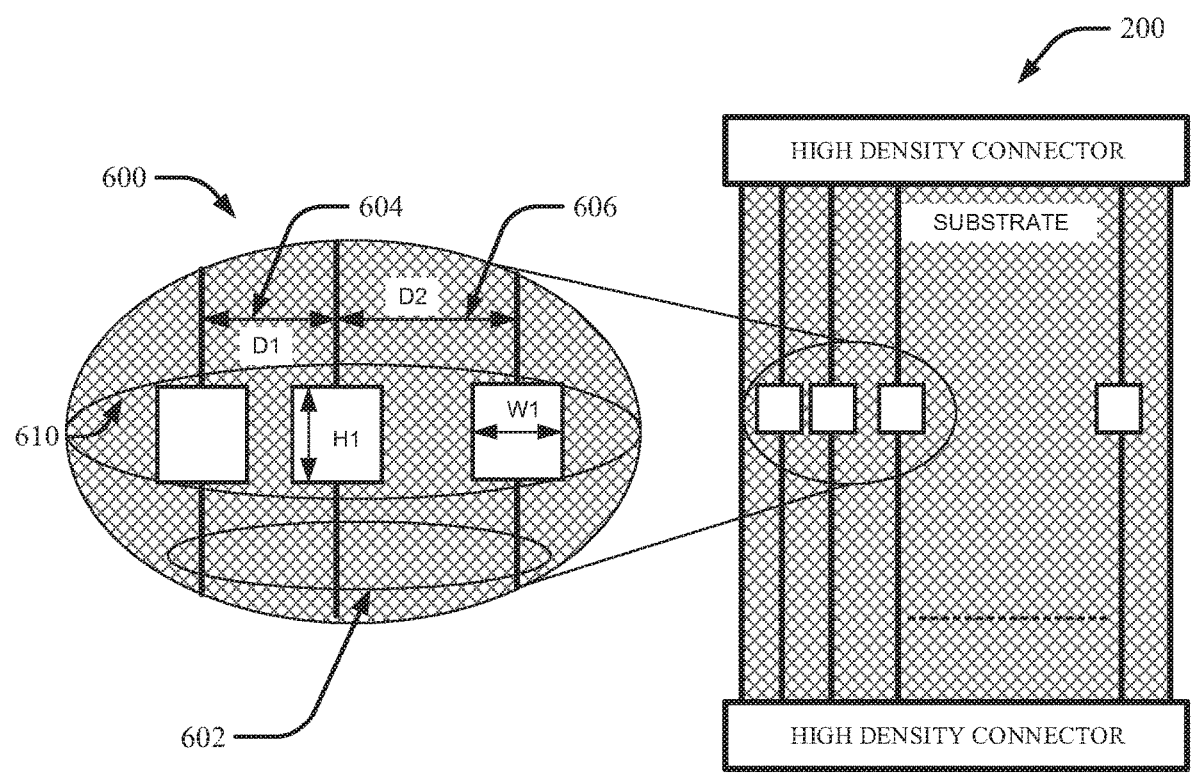
FIG. 6 illustrates an example, non-limiting expanded view of the cryogenic device of FIG. 2 in accordance with one or more embodiments described herein.

FIG. 6 illustrates an example, non-limiting expanded view 600 of the cryogenic device 200 of FIG. 2 in accordance with one or more embodiments described herein. As depicted, the expanded view 600 of the cryogenic device 200 shows an exemplary arrangement of the transmission lines 602. The transmission lines 602 are formed with a separation of D1 604 and D2 606. In some examples, the arrangement of the transmission lines 602 can be based on size of integrated microwave attenuators 610 and the material used (e.g. metal alloy) to secure the integrated microwave attenuators 610 to the transmission lines 602. Also, the size of the integrated microwave attenuators 610 vary depending on required attenuation of transmission power for the transmission lines 602. Also, depending on which stage of refrigeration (112, 114, or 116 of 100, FIG. 1) the cryogenic device 600 is operating in, the size of the integrated microwave attenuator 610 (e.g., H1 value and W1 value) can vary; thereby varying the arrangement of the transmission lines 602.

Figure 7:
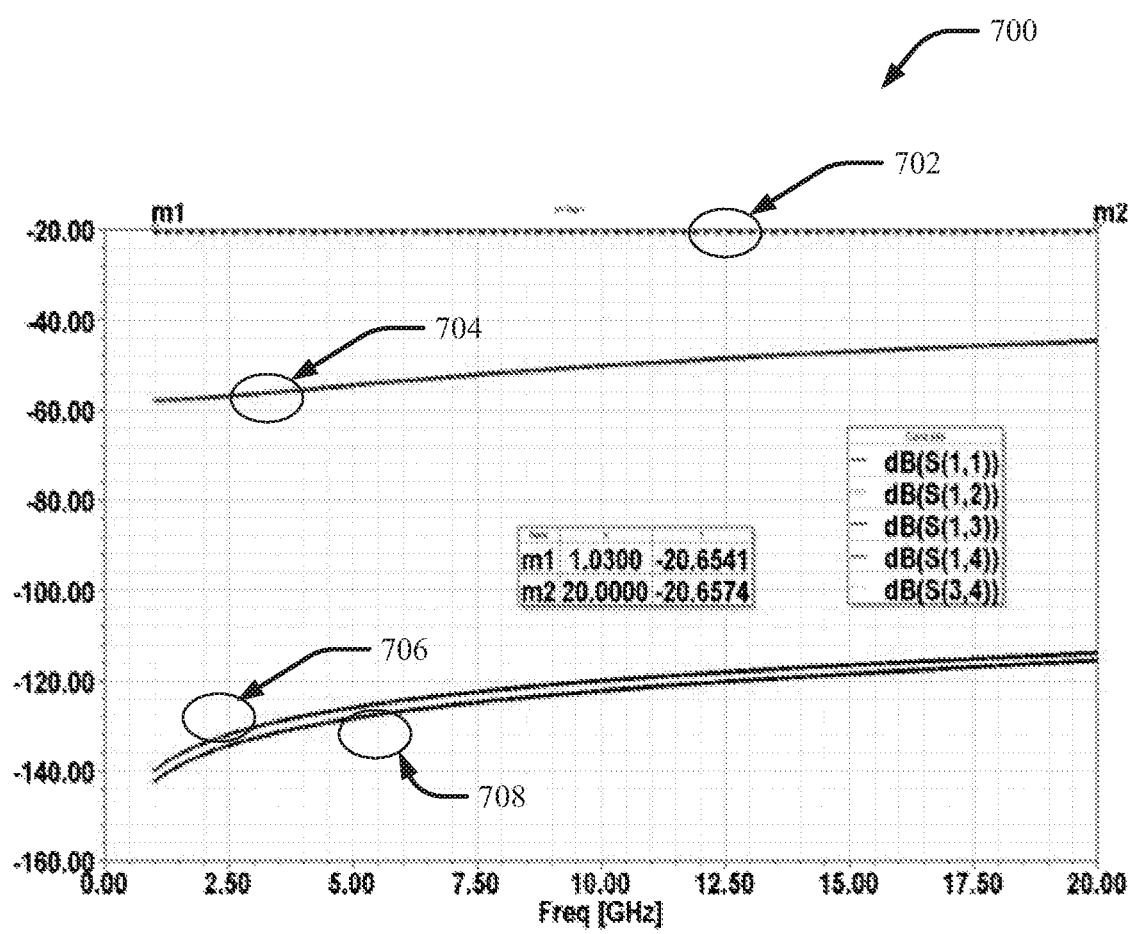
FIG. 7 illustrates example, non-limiting simulation data from testing of the cryogenic device in accordance with one or more embodiments described herein.

FIG. 7 illustrates example, non-limiting simulation data 700 from testing of the cryogenic device 200 in accordance with one or more embodiments described herein. As depicted, line 702 illustrates test results generated using an exemplary integrated microwave attenuator 300 according to an embodiment. Line 704 illustrates test results of the reflection coefficient. Lines 706 and 708 illustrate crosstalk levels between the two transmission lines that holds the integrated microwave attenuator 300.

Results from the simulation indicate the following: the integrated microwave attenuator 300 is functioning at constant level, illustrated by line 702, across the 0 to 20 gigahertz (Ghz) spectrum. The crosstalk level of −20 dB for the integrated microwave attenuator 300 is deemed acceptable and desired. Line 704 focuses on reflection coefficient indicating that the input power is not reflected back to the source but dissipated by the integrated microwave attenuator 300. The crosstalk between −60 dB and −40 dB, which is 10 dB to 20 dB below the attenuation, is deemed acceptable.

The lines 706 and 708 focus on crosstalk between two transmission lines that hold the integrated microwave attenuator 300. The crosstalk level is below −50 dB for the entire frequency spectrum therefore at an acceptable level.

Figure 8:
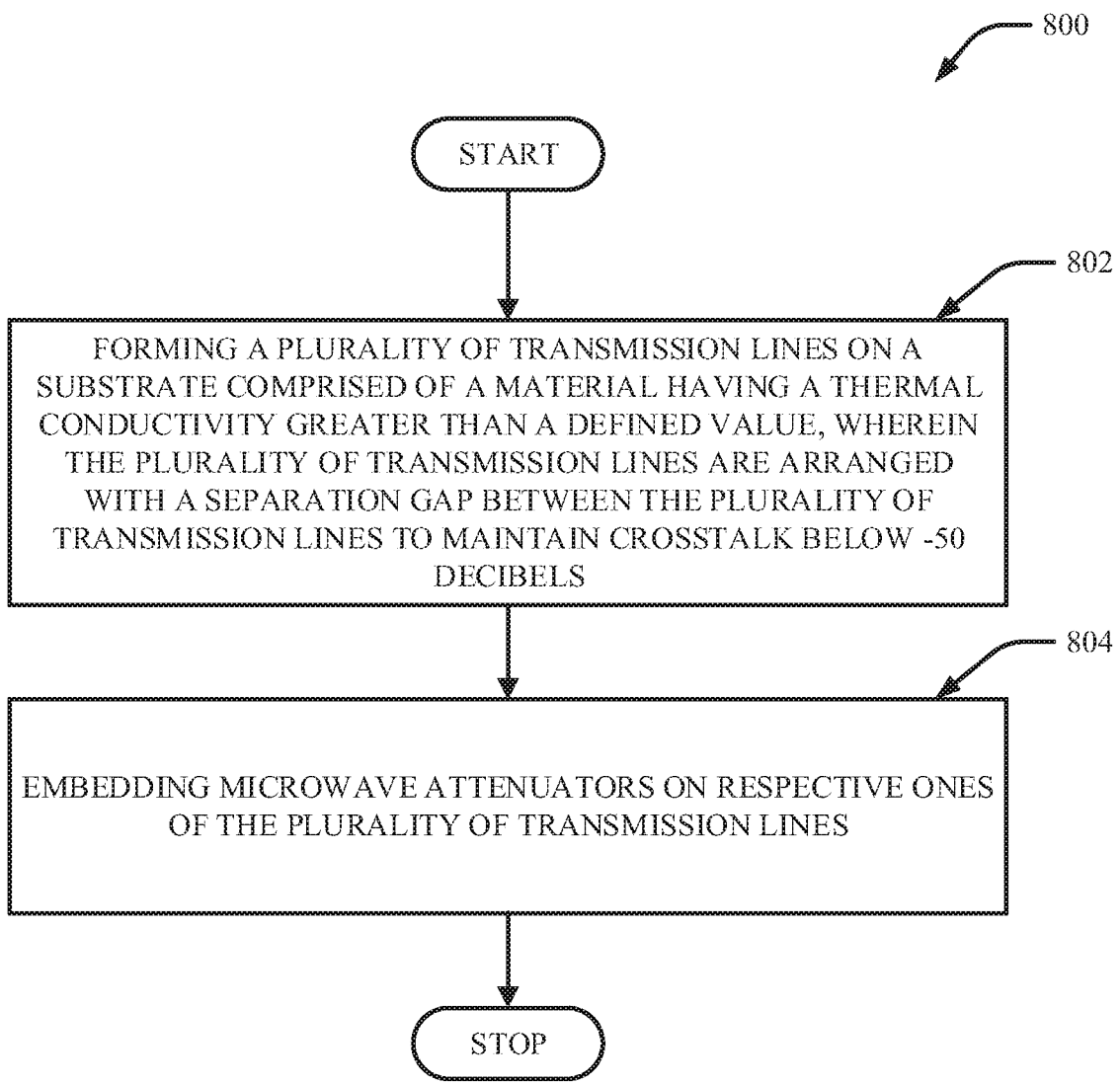
FIG. 8 illustrates a flow diagram of an example, non-limiting computer-implemented method that facilitates implementing a cryogenic device in accordance with one or more embodiments described herein.

FIG. 8 illustrates a flow diagram of an example, non-limiting computer-implemented method that facilitates implementing a cryogenic device 200 (FIG. 2) in accordance with one or more embodiments described herein. In some examples, flow diagram 800 can be implemented by operating environment 1100. It can be appreciated that the operations of flow diagram 800 can be implemented in a different order than is depicted. It can also be appreciated that the operations of flow diagram 800 can be implemented in a different order than is depicted.

In non-limiting example embodiments, a computing device (or system) (e.g., a computer) is provided comprising one or more processors and one or more memories that stores executable instructions that, when executed by the one or more processors, can facilitate performance of the operations as described herein, including the non-limiting methods as illustrated in the flow diagrams of FIG. 8. As a non-limiting example, the one or more processors can facilitate performance of the methods by directing or controlling one or more equipment operable to perform semiconductor fabrication.

Operation 802 depicts forming (e.g., by a computer) a plurality of transmission lines 220 (FIG. 2) on a substrate 206 (FIG. 2) comprised of a material having a thermal conductivity greater than a defined value, wherein the plurality of transmission lines 220 are arranged with a separation gap 510 (FIG. 5) between the plurality of transmission lines to maintain crosstalk below −50 decibels. Operation 804 depicts embedding (e.g., by a computer) microwave attenuators 208 (FIG. 2) on respective ones of the plurality of transmission lines 220.

Figure 9:
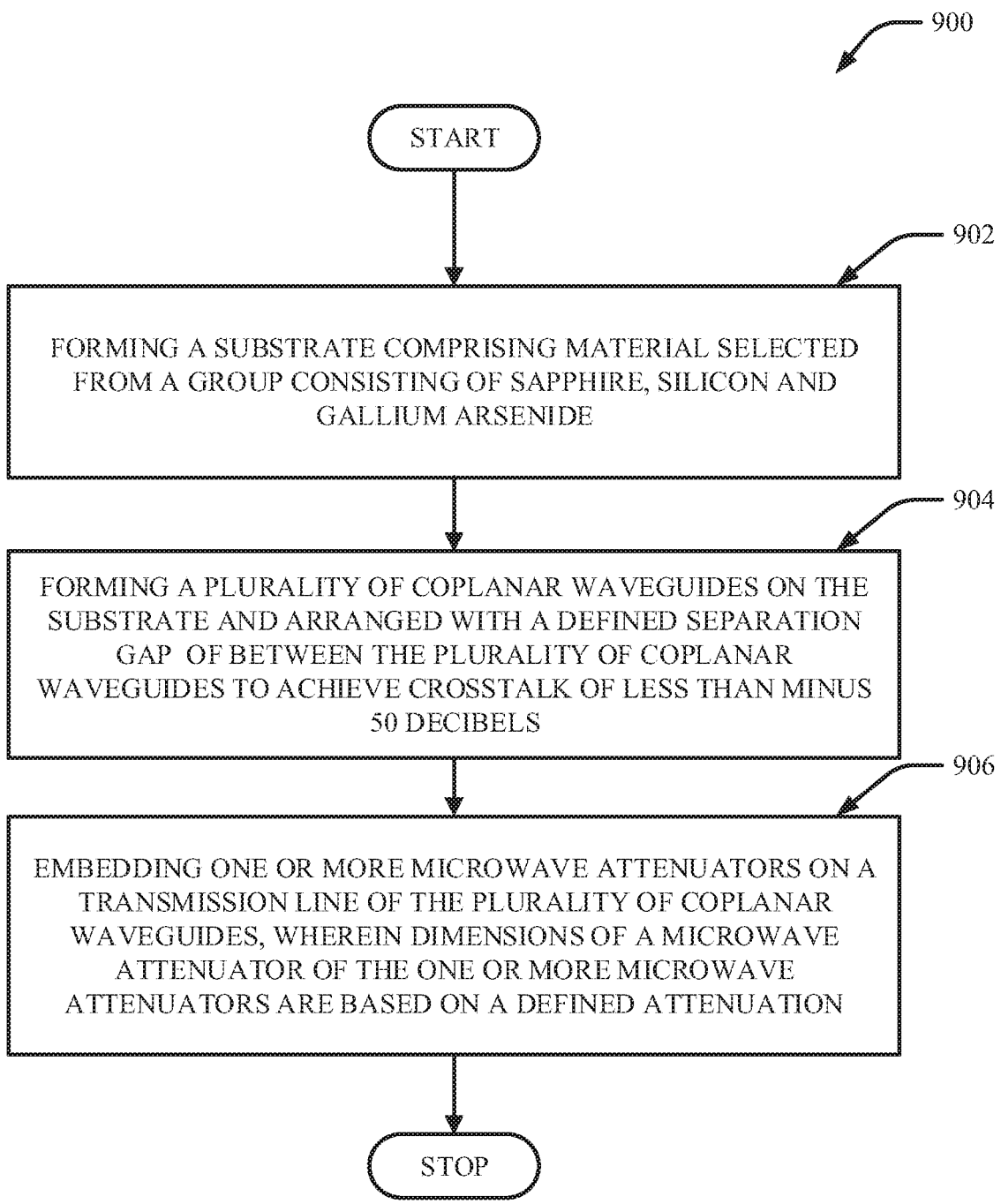
FIG. 9 illustrates a flow diagram of an example, non-limiting computer-implemented method that facilitates implementing a cryogenic device in accordance with one or more embodiments described herein.

FIG. 9 illustrates a flow diagram of an example, non-limiting computer-implemented method that facilitates implementing a cryogenic device 200 (FIG. 2) in accordance with one or more embodiments described herein. In some examples, flow diagram 900 can be implemented by operating environment 1100. It can be appreciated that the operations of flow diagram 900 can be implemented in a different order than is depicted. It can also be appreciated that the operations of flow diagram 900 can be implemented in a different order than is depicted.

In non-limiting example embodiments, a computing device (or system) (e.g., a computer) is provided comprising one or more processors and one or more memories that stores executable instructions that, when executed by the one or more processors, can facilitate performance of the operations as described herein, including the non-limiting methods as illustrated in the flow diagrams of FIG. 9. As a non-limiting example, the one or more processors can facilitate performance of the methods by directing or controlling one or more equipment operable to perform semiconductor fabrication.

Operation 902 depicts forming (e.g., by a computer) a substrate 206 (FIG. 2) comprising material selected from a group consisting of Sapphire, Silicon and Gallium Arsenide. Operation 904 depicts forming (e.g., by a computer) forming a plurality of coplanar waveguides 220 (FIG. 2) on the substrate 206 and arranged with a defined separation gap 510 (FIG. 5) between the plurality of coplanar waveguides 220 to achieve crosstalk of less than minus 50 decibels. Operation 906 depicts embedding (e.g., by a computer) microwave attenuators 208 (FIG. 2) on a transmission line 506 (FIG. 5) of the plurality of coplanar waveguides 220, wherein dimensions of a microwave attenuator 300 (FIG. 3) of the one or more microwave attenuators 208 are based on a defined attenuation level.

Figure 10:
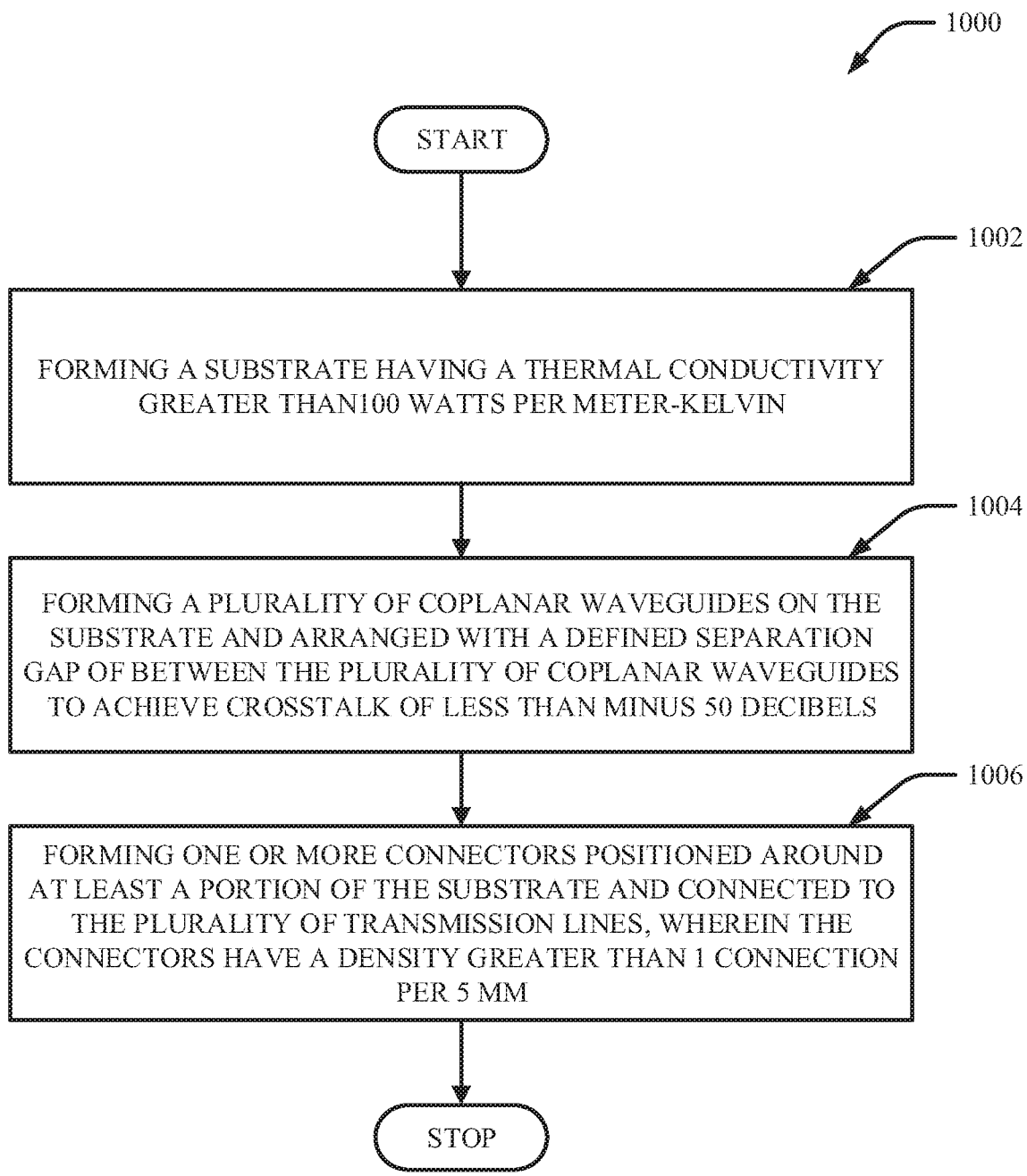
FIG. 10 illustrates a flow diagram of an example, non-limiting computer-implemented method that facilitates implementing a cryogenic device in accordance with one or more embodiments described herein.

FIG. 10 illustrates a flow diagram of an example, non-limiting computer-implemented method that facilitates implementing a cryogenic device 200 (FIG. 2) in accordance with one or more embodiments described herein. In some examples, flow diagram 1000 can be implemented by operating environment 1100. It can be appreciated that the operations of flow diagram 1000 can be implemented in a different order than is depicted. It can also be appreciated that the operations of flow diagram 1000 can be implemented in a different order than is depicted.

In non-limiting example embodiments, a computing device (or system) (e.g., a computer) is provided comprising one or more processors and one or more memories that stores executable instructions that, when executed by the one or more processors, can facilitate performance of the operations as described herein, including the non-limiting methods as illustrated in the flow diagrams of FIG. 10. As a non-limiting example, the one or more processors can facilitate performance of the methods by directing or controlling one or more equipment operable to perform semiconductor fabrication.

Operation 1002 depicts forming (e.g., by a computer) a substrate 206 (FIG. 2) having a thermal conductivity greater than 100 watts per meter-Kelvin. Operation 1004 depicts forming (e.g., by a computer) a plurality of coplanar waveguides 220 (FIG. 2) on the substrate 206 and arranged with a defined separation gap 506 (FIG. 5) between the plurality of coplanar waveguides 220 to achieve crosstalk of less than minus 50 decibels. Operation 1006 depicts embedding (e.g., by a computer) one or more microwave attenuators 208 (FIG. 2) on a transmission line 506 (FIG. 5) of the plurality of coplanar waveguides 220.

Figure 11:
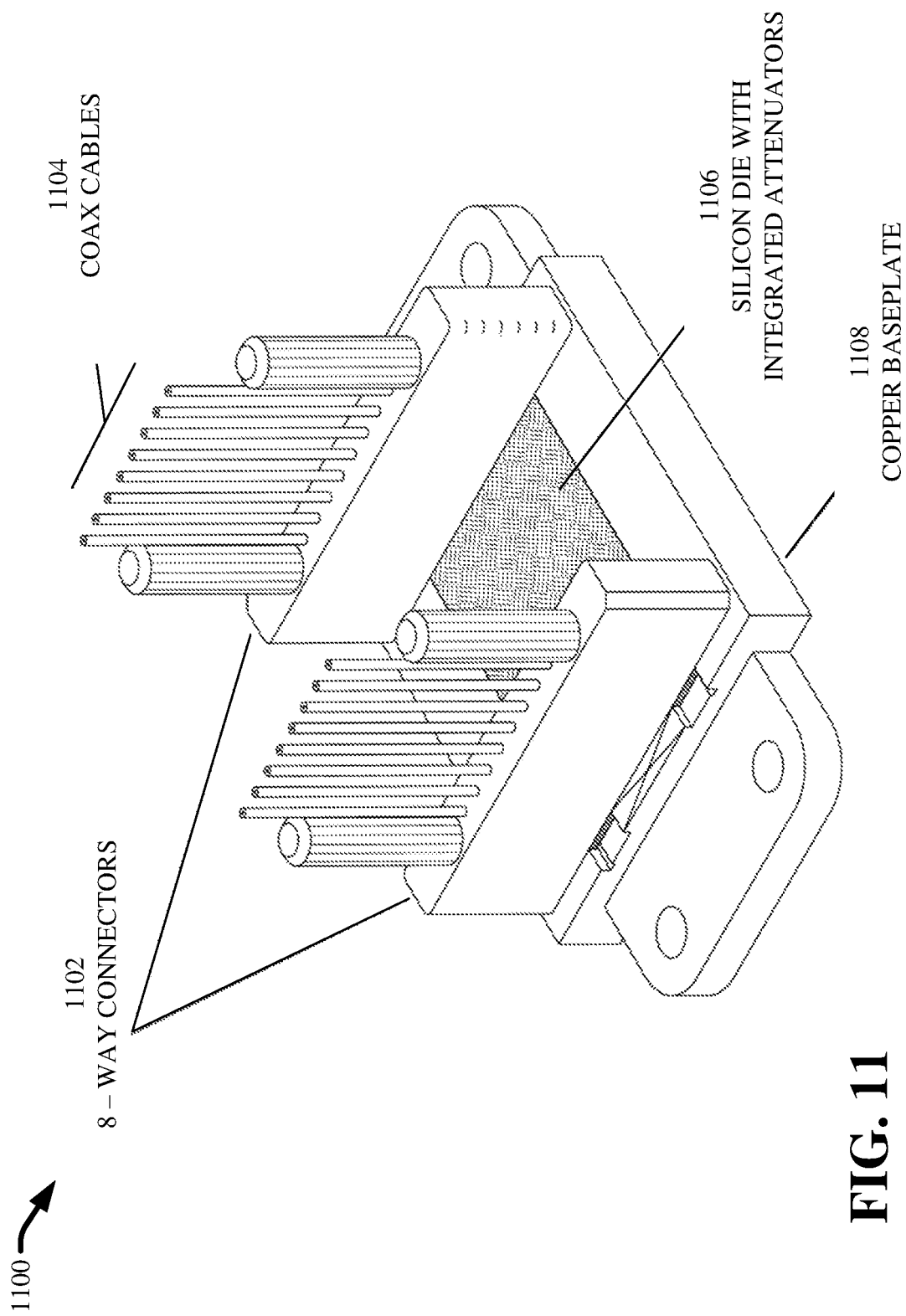
FIG. 11 illustrates an example, non-limiting cryogenic device in accordance with one or more embodiments described herein.

FIG. 11 illustrates an example, non-limiting cryogenic device 1100 in accordance with one or more embodiments described herein. As depicted, the exemplary cryogenic device comprises two high-density connectors 1102 (e.g. connectors 204 and 210 of FIG. 1) having a plurality of coax cables (e.g., input lines 202 and output lines 214 of FIG. 1). In an embodiment, each connector 1102 comprises eight coax cables 1104. The high-density connectors 1102 are connected to a silicon die substrate 1106 (e.g., substrate 206 of FIG. 1) composed of transmission lines having integrated microware attenuator (e.g., transmission lines 220 and integrated microwave attenuators 208 of FIG. 1). In some examples, the substrate 1106 and the connectors 1102 are formed on a copper baseplate 1108.

Embodiments of the present innovation may be a system, a method, an apparatus and/or a computer program product at any possible technical detail level of integration. The computer program product can include a computer readable storage medium (or media) having computer readable program instructions thereon for causing a processor to carry out aspects of the present innovation. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of various aspects of the present innovation can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to customize the electronic circuitry, to perform aspects of the present innovation.

Aspects of the present innovation are described herein with reference to flowchart illustrations and/or block diagrams of methods, apparatus (systems), and computer program products according to embodiments of the innovation. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the figures illustrate the architecture, functionality, and operation of possible implementations of systems, methods, and computer program products according to various embodiments of the present innovation. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that executes on a computer and/or computers, those skilled in the art will recognize that this disclosure also can or can be implemented in combination with other program modules. Generally, program modules include routines, programs, components, data structures, etc. that perform tasks and/or implement abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments where tasks are performed by remote processing devices that are linked through a communications network. However, some, if not all aspects of this disclosure can be practiced on stand-alone computers. In a distributed computing environment, program modules can be located in both local and remote memory storage devices.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other means to execute software or firmware that confers at least in part the functionality of the electronic components. In an aspect, a component can emulate an electronic component via a virtual machine, e.g., within a server computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or nonvolatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems, computer program products, and computer-implemented methods. It is, of course, not possible to describe every conceivable combination of components, products and/or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim. The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:
1. A device, comprising:
a substrate having a thermal conductivity above a defined threshold;

a plurality of transmission lines fabricated on the substrate and arranged with a separation gap between the plurality of transmission lines to maintain crosstalk below about −50 decibels;
one or more microwave attenuators embedded on the plurality of transmission lines; and
one or more connectors positioned around at least a portion of the substrate and connected to the plurality of transmission lines, wherein a connector of the one or more connectors has a density greater than 1 connection per 5 millimeter (mm).

2. The device of claim 1, wherein the substrate is composed of a material selected from the group consisting of: Sapphire and Silicon and Gallium Arsenide.

3. The device of claim 1, wherein at least one transmission line of the plurality of transmission lines is a coplanar waveguide.

4. The device of claim 1, wherein at least one transmission line of the plurality of transmission lines is comprised of a microstrip geometry.

5. The device of claim 1, wherein at least one transmission line of the plurality of transmission lines is comprised of a stripline geometry.

6. The device of claim 1, further comprising:
a metal alloy coupled to at least one of the one or more microwave attenuators on the plurality of transmission lines.

7. The device of claim 1, further comprising:
a resistive element coupled between at least one of the one or more microwave attenuators and the plurality of transmission lines.

8. The device of claim 1, wherein the one or more microwave attenuators comprises a metal alloy composed of a material selected from the group consisting of Nichrome, Constantan, and Manganin.

9. A structure, comprising:
a substrate comprising a material selected from a group consisting of Sapphire, Silicon and Gallium Arsenide;
a plurality of transmission lines fabricated on the substrate and arranged such that crosstalk between the plurality of transmission lines is below −50 decibels;
one or more microwave attenuators embedded in a transmission line of the plurality of transmission lines, wherein an attenuation value of a microwave attenuator of the one or more microwave attenuators are set to a desired attenuation level; and
one or more connectors connected to the plurality of transmission lines and positioned around at least a portion of the substrate and connected to the plurality of transmission lines, wherein a connector of the one or more connectors have a density greater than 1 connection per 5 millimeters (mm).

10. The structure of claim 9, wherein the microwave attenuator comprises a metal alloy composed of a material selected from the group consisting of Nichrome, Constantan, and Manganin.

11. The structure of claim 9, wherein at least one transmission line of the plurality of transmission lines is a coplanar waveguide.

12. A method, comprising:
forming a plurality of transmission lines on a substrate comprised of a material having a thermal conductivity greater than a defined value, wherein the plurality of transmission lines are arranged with a separation gap between the plurality of transmission lines to maintain crosstalk below −50 decibels;
embedding microwave attenuators on respective ones of the plurality of transmission lines; and
coupling, one or more connectors around the substrate, wherein a connector of the one or more connectors has a density greater than 1 connection per 5 millimeters (mm), and wherein the one or connectors is connected to the plurality of transmission lines.

13. The method of claim 12, wherein the forming the plurality of transmission lines on the substrate comprises forming the plurality of transmission lines on the substrate composed of a material selected from the group consisting of Sapphire and Silicon and Gallium Arsenide.

14. The method of claim 12, wherein the forming the plurality of transmission lines comprises forming the plurality of transmission lines such that at least one transmission line of the plurality of transmission lines is a coplanar waveguide.

15. The method of claim 12, wherein the forming the plurality of transmission lines comprises forming the plurality of transmission lines such that at least one transmission line of the plurality of transmission lines is comprised of a microstrip geometry.

16. The method of claim 12, wherein the forming the plurality of transmission lines comprises forming the plurality of transmission lines such that at least one transmission line of the plurality of transmission lines is comprised of a stripline geometry.

17. The method of claim 12, further comprising:
providing a metal alloy on one or more of the microwave attenuators.

18. The method of claim 12, further comprising:
coupling a resistive element between at least one of the microwave attenuators and the plurality of transmission lines, wherein the resistive element exhibits resistivity from room temperature to a cryogenic temperature without a superconducting transition.

19. The method of claim 12, wherein the microwave attenuators is formed from a metal alloy composed of a material selected from the group consisting of Nichrome, Constantan, and Manganin.

20. A method, comprising:
forming a substrate comprising material selected from a group consisting of Sapphire, Silicon and Gallium Arsenide;
forming a plurality of coplanar waveguides on the substrate and arranged with a defined separation gap between the plurality of coplanar waveguides to achieve crosstalk of less than minus 50 decibels;
embedding one or more microwave attenuators on a transmission line of the plurality of coplanar waveguides, wherein dimensions of a microwave attenuator of the one or more microwave attenuators are based on a defined attenuation level; and
one or more connectors positioned around at least a portion of the substrate, wherein a connector of the one or more connectors has a density greater than 1 connection per 5 millimeter (mm), and wherein the one or connectors is connected to the transmission line.

21. The method of claim 20, further comprising:
coupling a metal alloy between at least one of the one or more microwave attenuators and at least one of the plurality of coplanar waveguides; and
coupling the at least one of the one or more microwave attenuators to the substrate via a resistive material.

22. A method, comprising:
forming a substrate having a thermal conductivity greater than 100 watts per meter-Kelvin;

forming a plurality of coplanar waveguides on the substrate and arranged with a defined separation gap between the plurality of coplanar waveguides to achieve crosstalk of less than minus 50 decibels; and forming one or more connectors positioned around at least a portion of the substrate and connected to a plurality of transmission lines, wherein a connector of the one or more connectors have a density greater than 1 connection per 5 mm.

* * * * *